(12) United States Patent
Abe et al.

(10) Patent No.: US 11,772,202 B2
(45) Date of Patent: Oct. 3, 2023

(54) METHOD FOR MANUFACTURING LIGHT-EMITTING ELEMENT

(71) Applicant: NICHIA CORPORATION, Anan (JP)

(72) Inventors: Takashi Abe, Anan (JP); Eiji Shirakawa, Anan (JP)

(73) Assignee: NICHIA CORPORATION, Anan (JP)

( * ) Notice: Subject to any disclaimer, the term of this patent is extended or adjusted under 35 U.S.C. 154(b) by 205 days.

(21) Appl. No.: 17/489,417

(22) Filed: Sep. 29, 2021

(65) Prior Publication Data

US 2022/0097176 A1  Mar. 31, 2022

(30) Foreign Application Priority Data

Sep. 30, 2020 (JP) .................................. 2020-165878

(51) Int. Cl.
| | | |
|---|---|---|
| *H01L 33/00* | (2010.01) | |
| *B23K 26/53* | (2014.01) | |
| *B23K 26/062* | (2014.01) | |
| *H01S 5/02* | (2006.01) | |
| *B23K 101/40* | (2006.01) | |

(52) U.S. Cl.
CPC ............ *B23K 26/53* (2015.10); *B23K 26/062* (2015.10); *H01L 33/0095* (2013.01); *H01S 5/0202* (2013.01); *H01S 5/0213* (2013.01); *B23K 2101/40* (2018.08)

(58) Field of Classification Search
None
See application file for complete search history.

(56) References Cited

U.S. PATENT DOCUMENTS

| | | | |
|---|---|---|---|
| 9,337,620 B2* | 5/2016 | Fukaya | .................... H01L 33/20 |
| 2007/0111481 A1 | 5/2007 | Tamura et al. | |
| 2015/0064824 A1* | 3/2015 | Fukaya | .................... H01L 21/78 |
| | | | 438/33 |
| 2021/0098647 A1* | 4/2021 | Yamaguchi | ......... H01L 33/0095 |

FOREIGN PATENT DOCUMENTS

| | | |
|---|---|---|
| JP | 2007-165850 A | 6/2007 |
| JP | 2009-124077 A | 6/2009 |
| JP | 2015-050415 A | 3/2015 |
| JP | 2015-165532 A | 9/2015 |
| JP | 2015-216140 A | 12/2015 |
| JP | 2020-027858 A | 2/2020 |
| WO | WO-2012/029735 A1 | 3/2012 |
| WO | WO-2020/032190 A1 | 2/2020 |

* cited by examiner

*Primary Examiner* — Bradley Smith
(74) *Attorney, Agent, or Firm* — Foley & Lardner LLP

(57) ABSTRACT

In a method for manufacturing a light-emitting element, a second irradiation process includes forming a first modified region at a first distance from a second surface in a thickness direction of a sapphire substrate, forming a second modified region at a second distance from the second surface in the thickness direction, the second distance being less than the first distance, the second modified region being shifted in a first direction from the first modified region, and forming a third modified region at a third distance from the second surface in the thickness direction, the third distance being less than the second distance, the third modified region overlapping the first modified region in a top-view. In the thickness direction of the sapphire substrate, a greater number of modified regions that include second modified portions are formed than modified regions that include first modified portions.

14 Claims, 10 Drawing Sheets

METHOD FOR MANUFACTURING LIGHT-EMITTING ELEMENT

CROSS-REFERENCE TO RELATED APPLICATION

This application claims priority to Japanese Patent Application No. 2020-165878, filed on Sep. 30, 2020, the disclosure of which is hereby incorporated by reference in its entirety.

BACKGROUND

The disclosure relates to a method for manufacturing a light-emitting element.

Generally, for example, a light-emitting element is obtained by dicing a wafer in which a semiconductor layer is formed on a sapphire substrate. Methods for dicing a wafer include, for example, a known method in which a laser beam is concentrated in the substrate interior to form modified regions and the wafer is cleaved using the modified regions as starting points as described in WO2012/029735. Thus, the shape of the side surface of the cleaved sapphire substrate is dependent on the crystal plane of the sapphire substrate. Also, the shape of the side surface of the sapphire substrate affects the extraction efficiency of the light from the side surface.

SUMMARY

Embodiments of the disclosure are directed to a method for manufacturing a light-emitting element in which unevenness is easily formed in the side surface of a cleaved sapphire substrate.

According to one embodiment of the disclosure, a method for manufacturing a light-emitting element includes: providing a wafer comprising: a sapphire substrate having a first surface and a second surface opposite the first surface, and an element part that comprises a semiconductor layer located at the first surface; irradiating a laser beam into an interior of the sapphire substrate through the second surface side of the wafer, which comprises: a first irradiation process of scanning the laser beam along a first direction parallel to an a-axis direction of the sapphire substrate to form a plurality of first modified portions along the first direction in the interior of the sapphire substrate, the formation of the plurality of first modified portions being performed multiple times to form a plurality of modified regions at a first spacing at different distances from the second surface, each of the plurality of modified regions formed at the first spacing comprising the plurality of first modified portions along the first direction, and a second irradiation process of scanning the laser beam along a second direction parallel to an m-axis direction of the sapphire substrate to form a plurality of second modified portions along the second direction in the interior of the sapphire substrate, the formation of the plurality of second modified portions being performed multiple times to form a plurality of modified regions at a second spacing at different distances from the second surface, each of the plurality of modified regions formed at the second spacing comprising the plurality of second modified portions along the second direction, the second spacing being less than the first spacing. The second irradiation process comprises: forming a first modified region at a first distance from the second surface in a thickness direction of the sapphire substrate, forming a second modified region at a second distance from the second surface in the thickness direction of the sapphire substrate, the second distance being less than the first distance, the second modified region being shifted in the first direction from the first modified region, and forming a third modified region at a third distance from the second surface in the thickness direction of the sapphire substrate, the third distance being less than the second distance, the third modified region overlapping the first modified region in a top-view. In the thickness direction of the sapphire substrate, a number of the modified regions that include the second modified portions formed is greater than a number of the modified regions that include the first modified portions. The method further includes, after the step of irradiating a laser beam, separating the wafer into a plurality of light-emitting elements at the plurality of modified regions.

According to embodiments of the method for manufacturing the light-emitting element of the disclosure, an unevenness is easily formed in the side surface of a cleaved sapphire substrate.

DETAILED DESCRIPTION

Figure 1:
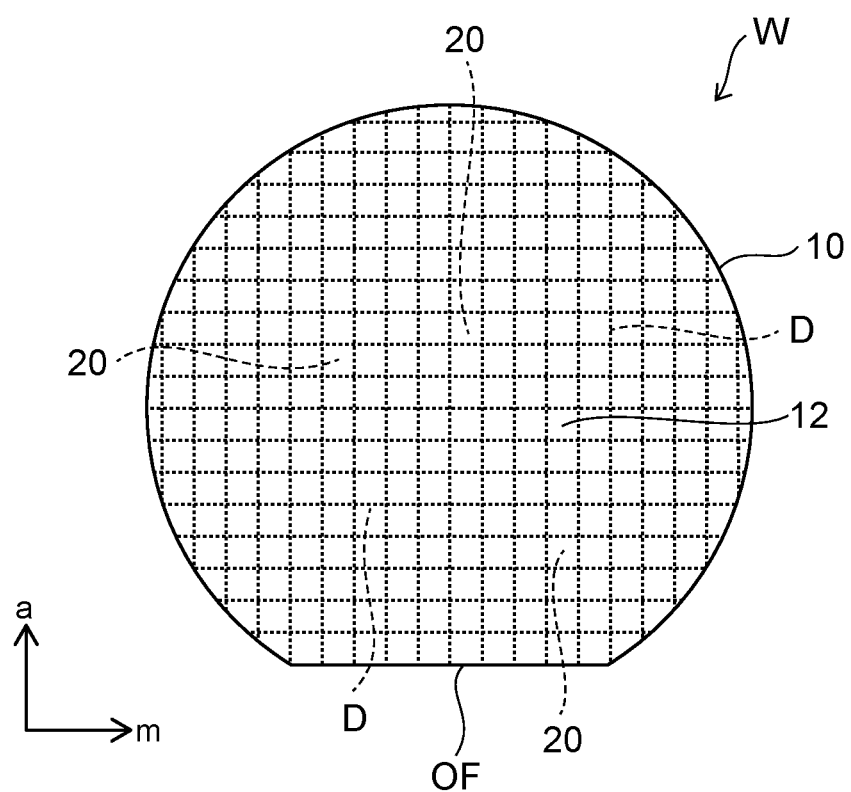
FIG. 1 is a schematic plan view of a wafer according to an embodiment of the disclosure.

Embodiments will now be described with reference to the drawings. The same components in the drawings are labeled with the same reference numerals.

Figure 2:
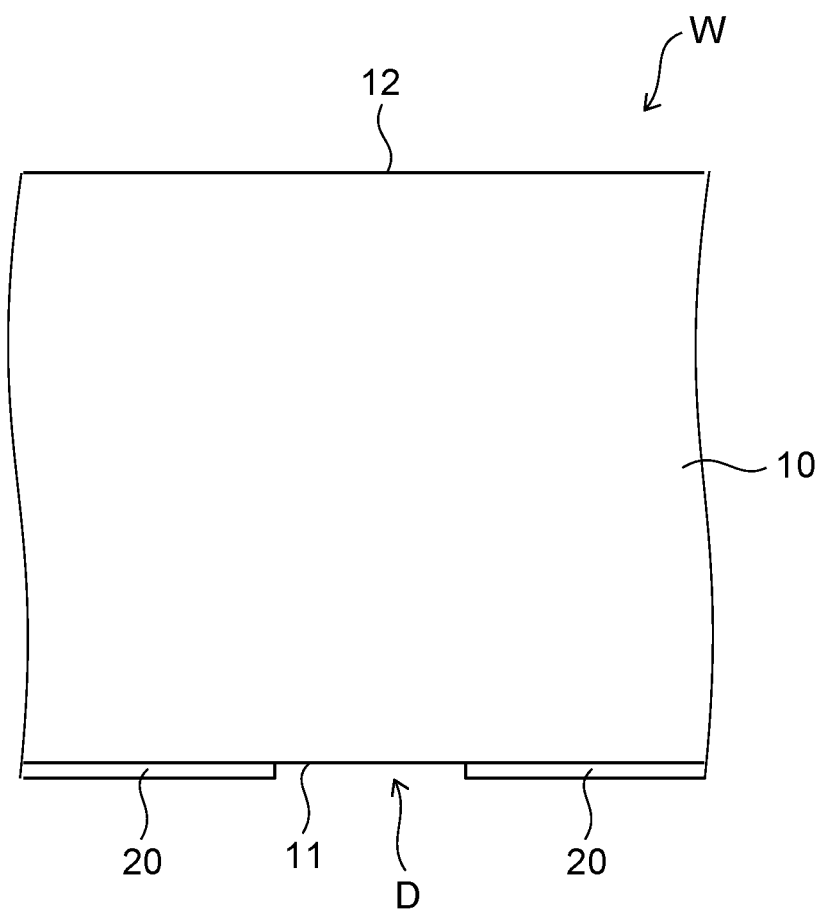
FIG. 2 is a schematic cross-sectional view of the wafer according to the embodiment of the disclosure.

FIG. 1 is a schematic plan view of a wafer W according to an embodiment. FIG. 2 is a schematic cross-sectional view of a portion of the wafer W at which a dicing street D is formed.

The wafer W includes a sapphire substrate 10 and an element part 20. The sapphire substrate 10 includes a first surface 11, and a second surface 12 at the side opposite to the first surface 11. The thickness of the sapphire substrate 10 is, for example, not less than 500 µm and not more than 1000 µm, and specifically, about 700 µm.

The element part 20 is located at the first surface 11 of the sapphire substrate 10. The element part 20 includes a semiconductor layer that is grown at the first surface 11. The semiconductor layer is, for example, a nitride semiconductor layer that includes Al and Ga. The semiconductor layer includes an active layer that emits light. For example, the peak wavelength of the light from the active layer is not more than 400 nm, and specifically not less than 250 nm and not more than 350 nm. For example, the active layer emits deep ultraviolet light.

The element part 20 further includes electrodes that are electrically connected to the semiconductor layer, and an insulating film that covers the semiconductor layer. The first surface 11 is, for example, a c-plane of the sapphire crystal. The first surface 11 may be tilted with respect to the c-plane within a range in which the semiconductor layer can be formed to have good crystallinity.

In FIG. 1, a first direction a illustrates a direction parallel to an a-axis direction of the sapphire substrate 10, and a second direction m illustrates a direction parallel to an m-axis direction of the sapphire substrate 10. An orientation flat OF of the sapphire substrate 10 is an a-plane.

For example, the multiple dicing streets D are formed in a lattice configuration along the first and second directions a and m in the wafer W. The dicing street D is a boundary region between the multiple light-emitting elements singulated by the cleaving of the wafer W, and has a width that is set so that the cleaving of the wafer W does not affect the element part 20. Also, the dicing street D is a scanning region of the laser beam for forming the first modified portions and the second modified portions that are described below inside the sapphire substrate 10.

For example, the element part 20 is not formed in the dicing street D. The multiple element parts 20 are separated on the first surface 11 of the sapphire substrate 10 by the dicing street D. The element part 20 may not be separated by the dicing street D and may be formed over the entire surface of the first surface 11 of the sapphire substrate 10.

The method for manufacturing the light-emitting element according to embodiments includes a process of preparing the wafer W, a laser beam irradiation process, and a separation process.

Laser Beam Irradiation Process

In the laser beam irradiation process, a laser beam is irradiated through the second surface 12 side of the wafer W into the interior of the sapphire substrate 10. The laser beam is scanned along each of the multiple dicing streets D while being irradiated through the second surface 12 side into the interior of the sapphire substrate 10. First, the laser beam is scanned along the dicing streets D that extend in one of the first direction a or the second direction m shown in FIG. 1; subsequently, the laser beam is scanned along the dicing streets D that extend in the other direction.

For example, the laser beam is emitted in pulse form. The pulse width of the laser beam is, for example, not less than 100 fsec and not more than 800 psec. For example, a Nd:YAG laser, a titanium sapphire laser, a Nd:YVO$_4$ laser, a Nd:YLF laser, or the like is used as the laser light source. The wavelength of the laser beam is a wavelength of light that passes through the sapphire substrate 10. For example, the laser beam has a peak wavelength in the range not less than 500 nm and not more than 1200 nm. It is favorable for the output of the laser beam to be, for example, not less than 0.1 µJ and not more than 20.0 µJ, more favorably not less than 1.0 µJ and not more than 15.0 µJ, and more favorably not less than 2.0 µJ and not more than 10.0 µJ.

The laser beam irradiation process includes a first irradiation process and a second irradiation process.

First Irradiation Process

Figure 3:
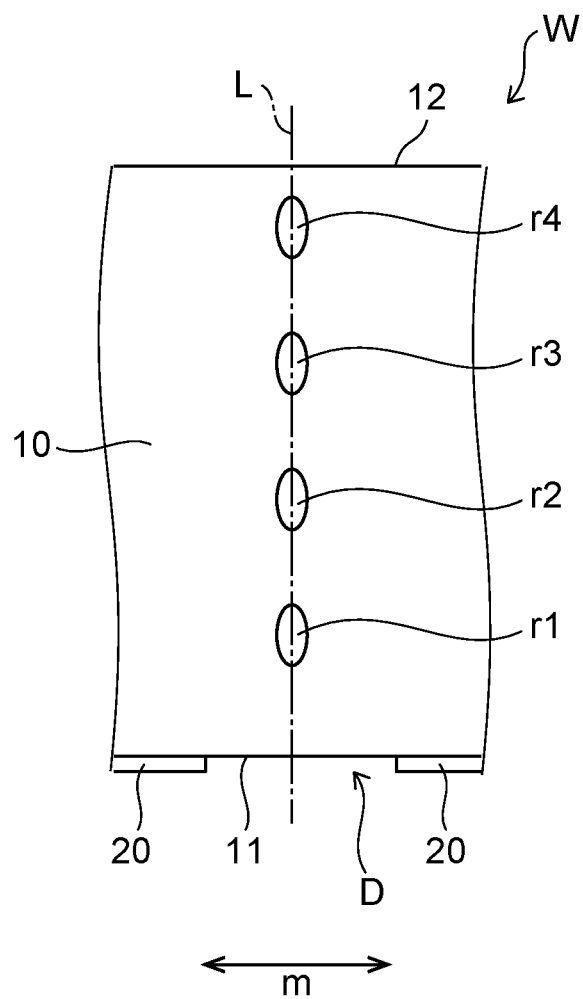
FIG. 3 is a schematic cross-sectional view showing a first irradiation process of a method for manufacturing a light-emitting element according to the embodiment of the disclosure.

FIG. 3 is a schematic cross-sectional view showing the first irradiation process. FIG. 3 is a schematic cross-sectional view of the portion at which the dicing street D is formed, and illustrates a cross section along the second direction m. In FIG. 3, the first direction a is a direction through the page surface.

Figure 4:
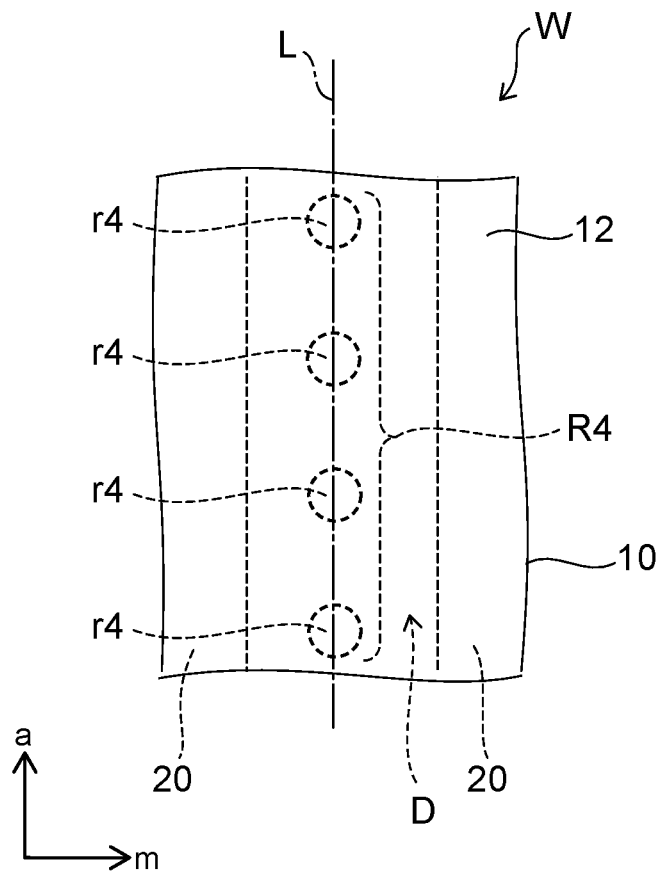
FIG. 4 is a schematic plan view showing the first irradiation process of the method for manufacturing the light-emitting element according to the embodiment of the disclosure.

FIG. 4 is a schematic plan view showing the first irradiation process. FIG. 4 illustrates the upper surface of the portion of the wafer W at which the dicing street D is formed when viewed from the second surface 12 side of the sapphire substrate 10. Among multiple first modified portions r1 to r4, the first modified portion r4 that is most proximate to the second surface 12 is shown in FIG. 4.

Figure 5:
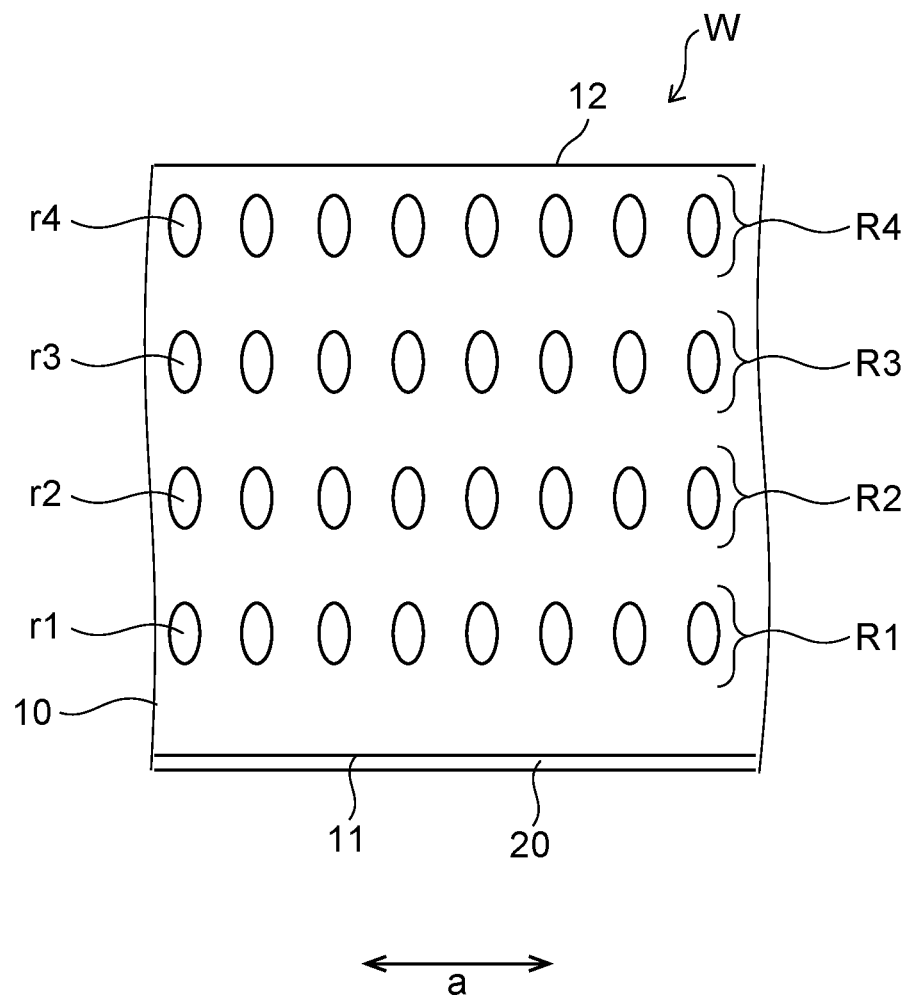
FIG. 5 is a schematic cross-sectional view showing the first irradiation process of the method for manufacturing the light-emitting element according to the embodiment of the disclosure.

FIG. 5 is a schematic cross-sectional view showing the first irradiation process. FIG. 5 is a schematic cross-sectional view of the portion at which the dicing street D is formed, and illustrates a cross section along the first direction a. In FIG. 5, the second direction m is a direction through the page surface.

The laser beam that is irradiated through the second surface 12 side into the interior of the sapphire substrate 10 is concentrated so that the energy of the laser beam is concentrated at a prescribed depth in the interior of the sapphire substrate 10. The first modified portions r1 to r4 are more embrittled than the portions not irradiated with the laser beam, and are formed in the interior of the sapphire substrate 10 at the irradiation portions (the concentration portions) of the laser beam.

A process of scanning the laser beam along the first direction a of the sapphire substrate 10 to form multiple first modified portions along the first direction a in the interior of the sapphire substrate 10 is performed multiple times. Thereby, multiple modified regions that each include the multiple first modified portions along the first direction a are formed at a first spacing at different distances from the second surface 12 in the thickness direction of the sapphire substrate 10.

As shown in FIG. 5, for example, a modified region R1 that includes the multiple first modified portions r1, a modified region R2 that includes the multiple first modified portions r2, a modified region R3 that includes the multiple first modified portions r3, and a modified region R4 that includes the multiple first modified portions r4 are formed at four different distances from the second surface 12. The four first modified portions r1 to r4 (the modified regions R1 to R4) are arranged in the thickness direction of the sapphire substrate 10.

First, the laser beam is scanned along the first direction a while discontinuously irradiating at the longest distance from the second surface 12 to form the modified region R1 that includes the multiple first modified portions r1 arranged along the first direction a at the longest distance from the second surface 12.

After the modified region R1 is formed, the laser beam is scanned along the first direction a while discontinuously irradiating to overlap the modified region R1 in a top-view as viewed from the second surface 12 side to form the modified region R2 that includes the multiple first modified portions r2 arranged along the first direction a. The first modified portion r2 overlaps the first modified portion r1 in a top-view. The first modified portion r2 is not limited to completely overlapping the first modified portion r1 in a top-view; rather, only a portion of the first modified portion r2 may overlap the first modified portion r1. The modified region R2 is not limited to completely overlapping the modified region R1 in a top-view; rather, only a portion of the modified region R2 may overlap the modified region R1.

After the modified region R2 is formed, the laser beam is scanned along the first direction a while discontinuously irradiating to overlap the modified region R2 in a top-view as viewed from the second surface 12 side to form the modified region R3 that includes the multiple first modified portions r3 arranged along the first direction a. The first modified portion r3 overlaps the first modified portion r2 in a top-view. The first modified portion r3 is not limited to completely overlapping the first modified portion r2 in a top-view; rather, only a portion of the first modified portion r3 may overlap the first modified portion r2. Also, the modified region R3 is not limited to completely overlapping the modified region R2 in a top-view; rather, only a portion of the modified region R3 may overlap the modified region R2.

After the modified region R3 is formed, the laser beam is scanned along the first direction a while discontinuously irradiating to overlap the modified region R3 in a top-view as viewed from the second surface 12 side to form the modified region R4 that includes the multiple first modified portions r4 arranged along the first direction a. The first modified portion r4 overlaps the first modified portion r3 in a top-view. The first modified portion r4 is not limited to completely overlapping the first modified portion r3 in a top-view; rather, only a portion of the first modified portion r4 may overlap the first modified portion r3. Also, the modified region R4 is not limited to completely overlapping the modified region R3 in a top-view; rather, only a portion of the modified region R4 may overlap the modified region R3.

A cleaving line L is illustrated by a single dot-dash line in FIGS. 3 and 4. The cleaving line L is a virtual line. In this case, the wafer W is cleaved along the first direction a by pressing a pressing member onto the wafer W along the cleaving line L in the separation process after the laser irradiation process. For example, the pressing member is pressed along the cleaving line L from the first surface 11 side.

At least a portion of the first modified portion r1, at least a portion of the first modified portion r2, at least a portion of the first modified portion r3, and at least a portion of the first modified portion r4 overlap the cleaving line L.

The irradiation spacing of the laser beam along the first direction a when forming each of the modified regions R1 to R4 is, for example, not less than 8 μm and not more than 15 μm.

In the first irradiation process, one first modified portion r1 is formed by irradiating the laser beam multiple times. For example, one first modified portion r1 is formed by irradiating the laser beam three times at the same position. The scanning along the first direction a is repeated three times while irradiating the laser beam one irradiation at a time at the positions at which the first modified portions r1 are formed. By scanning the laser beam three times along the first direction a, the modified region R1 that includes the multiple first modified portions r1 formed by irradiating the laser beam three times is formed.

One first modified portion r2 also is formed by, for example, irradiating the laser beam three times at the same position. The scanning along the first direction a is repeated three times while irradiating the laser beam one irradiation at a time at the positions at which the first modified portions r2 are formed. By scanning the laser beam three times along the first direction a, the modified region R2 that includes the multiple first modified portions r2 formed by irradiating the laser beam three times is formed.

One first modified portion r3 also is formed by, for example, irradiating the laser beam three times at the same position. The scanning along the first direction a is repeated three times while irradiating the laser beam one irradiation at a time at the positions at which the first modified portions r3 are formed. By scanning the laser beam three times along the first direction a, the modified region R3 that includes the multiple first modified portions r3 formed by irradiating the laser beam three times is formed.

One first modified portion r4 also is formed by, for example, irradiating the laser beam three times at the same position. The scanning along the first direction a is repeated three times while irradiating the laser beam one irradiation at a time at the positions at which the first modified portions r4 are formed. By scanning the laser beam three times along the first direction a, the modified region R4 that includes the multiple first modified portions r4 formed by irradiating the laser beam three times is formed.

The first irradiation process described above is performed in each of the multiple dicing streets D extending in the first direction a shown in FIG. 1.

The second irradiation process will now be described. Either of the first irradiation process or the second irradiation process may be performed first.

Second Irradiation Process

Figure 6:
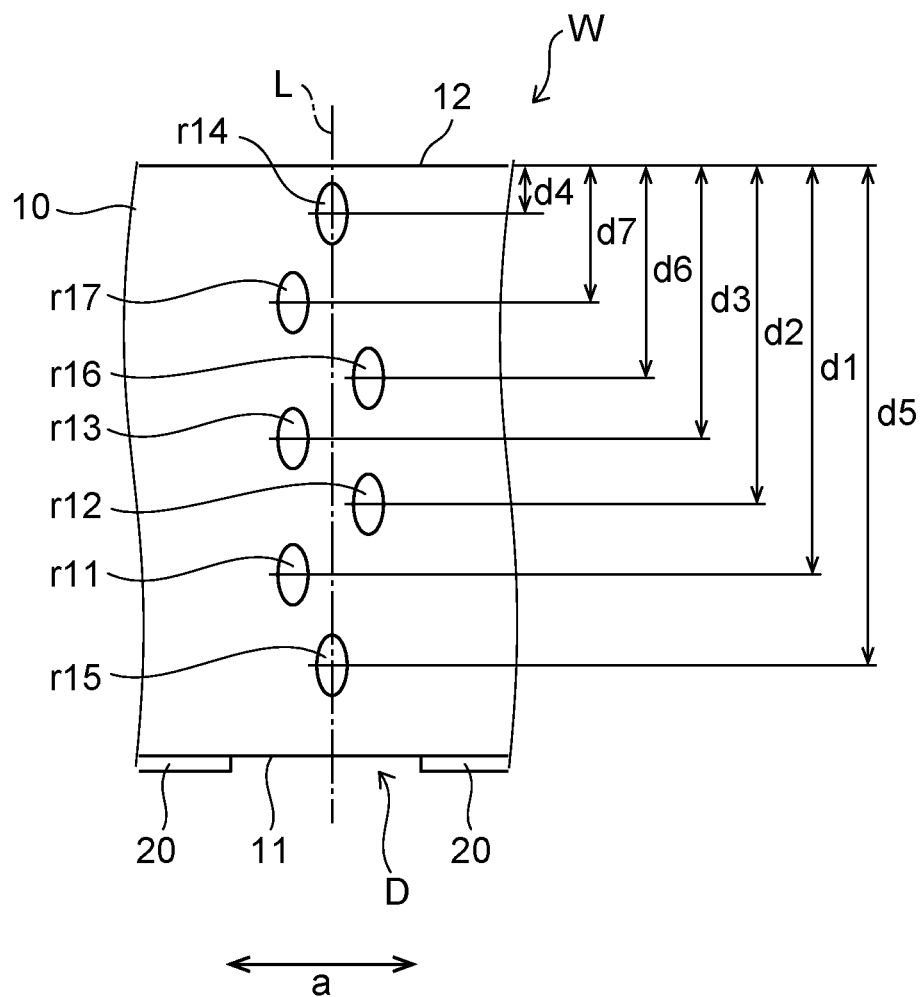
FIG. 6 is a schematic cross-sectional view showing a second irradiation process of the method for manufacturing the light-emitting element according to the embodiment of the disclosure.

FIG. 6 is a schematic cross-sectional view showing the second irradiation process. FIG. 6 is a schematic cross-sectional view of the portion at which the dicing street D is formed, and illustrates a cross section along the first direction a. In FIG. 6, the second direction m is a direction through the page surface.

Figure 7:
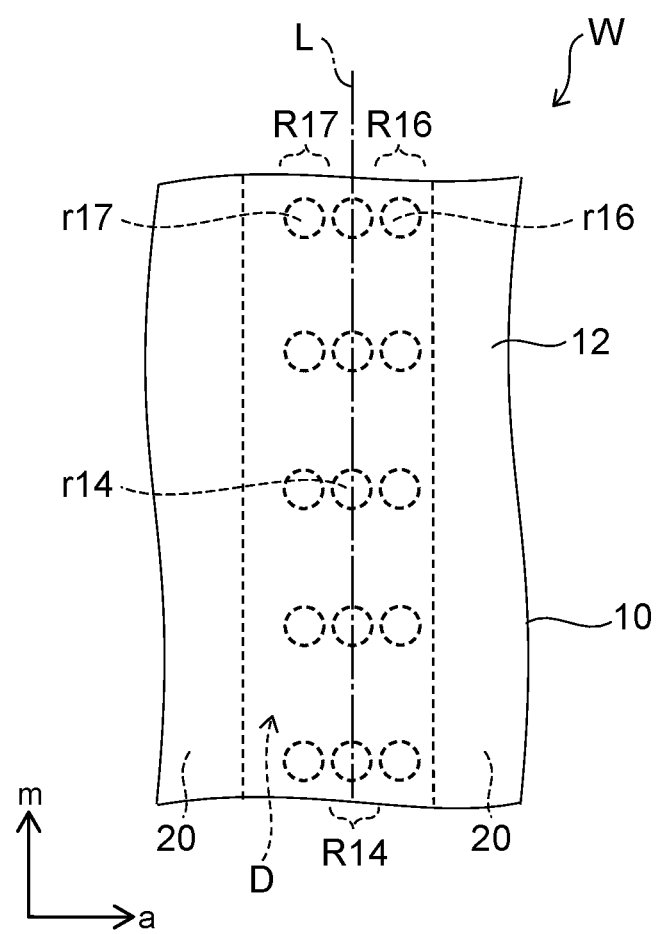
FIG. 7 is a schematic plan view showing the second irradiation process of the method for manufacturing the light-emitting element according to the embodiment of the disclosure.

FIG. 7 is a schematic plan view showing the second irradiation process. FIG. 7 illustrates the upper surface of the portion of the wafer W at which the dicing street D is formed when viewed from the second surface 12 side of the sapphire substrate 10.

Figure 8:
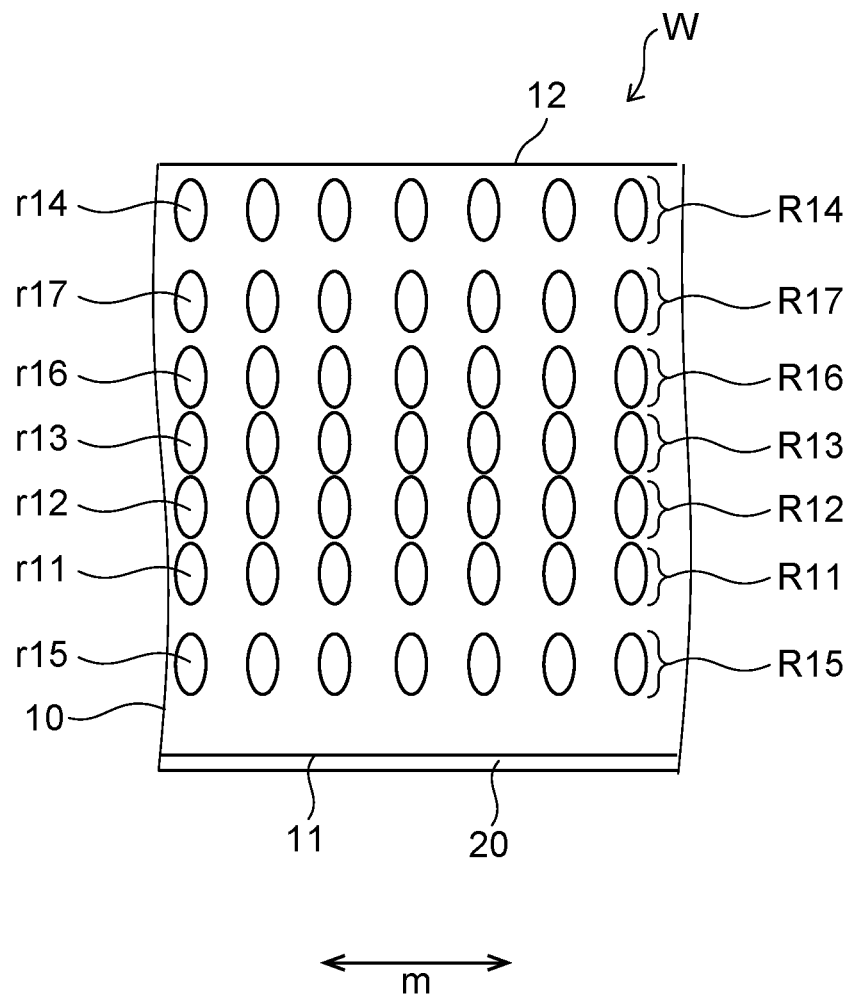
FIG. 8 is a schematic cross-sectional view showing the second irradiation process of the method for manufacturing the light-emitting element according to the embodiment of the disclosure.

FIG. 8 is a schematic cross-sectional view showing the second irradiation process. FIG. 8 is a schematic cross-sectional view of the portion at which the dicing street D is formed, and illustrates a cross section along the second direction m. In FIG. 8, the first direction a is a direction through the page surface.

In the second irradiation process as well, the laser beam that is irradiated through the second surface 12 side into the interior of the sapphire substrate 10 is concentrated so that the energy of the laser beam is concentrated at a prescribed depth in the interior of the sapphire substrate 10. The second modified portions r11 to r17 are more embrittled than the portions not irradiated with the laser beam, and are formed in the interior of the sapphire substrate 10 at the irradiation portions (the concentration portions) of the laser beam.

A process of scanning the laser beam along the second direction m of the sapphire substrate 10 to form the multiple second modified portions along the second direction m in the interior of the sapphire substrate 10 is performed multiple times. Thereby, multiple modified regions that each include the multiple second modified portions along the second direction m are formed at a second spacing at different distances from the second surface 12 in the thickness direction of the sapphire substrate 10.

The number in the thickness direction of the sapphire substrate 10 of the multiple modified regions formed in the second irradiation process is greater than the number in the thickness direction of the sapphire substrate 10 of the multiple modified regions formed in the first irradiation process.

As shown in FIG. 8, for example, the modified regions are formed at seven different distances from the second surface 12. The modified regions include, for example, a fifth modified region R15 that includes the multiple second modified portions r15, a first modified region R11 that includes the multiple second modified portions r11, a second modified region R12 that includes the multiple second modified portions r12, a third modified region R13 that includes the multiple second modified portions r13, a sixth modified region R16 that includes the multiple second modified portions r16, a seventh modified region R17 that includes the multiple second modified portions r17, and a fourth modified region R14 that includes the multiple second modified portions r14. The seven second modified portions r11 to r17 (the modified regions R11 to R17) are arranged in the thickness direction of the sapphire substrate 10.

First, the laser beam is scanned along the second direction m while discontinuously irradiating at a fifth distance d5 (referring to FIG. 6) that is the longest distance from the second surface 12 in the thickness direction of the sapphire substrate 10. The fifth modified region R15 that includes the multiple second modified portions r15 arranged along the second direction m is formed at the fifth distance d5 from the second surface 12.

After the fifth modified region R15 is formed, the laser beam is scanned along the second direction m while discontinuously irradiating at the first distance d1 that is less than the fifth distance d5 from the second surface 12 in the thickness direction of the sapphire substrate 10 to be shifted in the first direction a from the fifth modified region R15 to form the first modified region R11 that includes the multiple second modified portions r11 arranged along the second direction m.

After the first modified region R11 is formed, the laser beam is scanned along the second direction m while discontinuously irradiating at the second distance d2 that is less than the first distance d1 from the second surface 12 in the thickness direction of the sapphire substrate 10 to be shifted in the first direction a from the first modified region R11 to form the second modified region R12 that includes the multiple second modified portions r12 arranged along the second direction m. The second modified region R12 is shifted in the first direction a from the fifth modified region R15. In the first direction a, the first modified region R11 and the second modified region R12 are shifted in mutually-opposite directions when referenced to the fifth modified region R15. In the first direction a, the distance between the first modified region R11 and the second modified region R12 is, for example, not less than 5 μm and not more than 15 μm. By setting the distance between the first modified region R11 and the second modified region R12 to be not less than 5 μm, a protrusion that is formed in the side surface of the sapphire substrate 10 can be larger. By setting the distance between the first modified region R11 and the second modified region R12 to be not more than 15 μm, a crack easily connects between the first modified region R11 and the second modified region R12, and the extension of unintentional cracks can be suppressed.

After the second modified region R12 is formed, the laser beam is scanned along the second direction m while discontinuously irradiating at a third distance d3 that is less than the second distance d2 from the second surface 12 in the thickness direction of the sapphire substrate 10 to overlap the first modified region R11 in a top-view as viewed from the second surface 12 side to form the third modified region R13 that includes the multiple second modified portions r13 arranged along the second direction m. The second modified portion r13 is shifted in the first direction a from the second modified portion r12 and overlaps the second modified portion r11 in a top-view. The second modified portion r13 is not limited to completely overlapping the second modified portion r11 in a top-view; rather, only a portion of the second modified portion r13 may overlap the second modified portion r11.

After the third modified region R13 is formed, the laser beam is scanned along the second direction m while discontinuously irradiating at a sixth distance d6 that is less than the third distance d3 from the second surface 12 in the thickness direction of the sapphire substrate 10 to overlap the second modified region R12 in a top-view as viewed from the second surface 12 side to form the sixth modified region R16 that includes the multiple second modified portions r16 arranged along the second direction m. The second modified portion r16 is shifted in the first direction a from the second modified portion r13 and overlaps the second modified portion r12 in a top-view. The second modified portion r16 is not limited to completely overlapping the second modified portion r12 in a top-view; rather, only a portion of the second modified portion r16 may overlap the second modified portion r12.

After the sixth modified region R16 is formed, the laser beam is scanned along the second direction m while discontinuously irradiating at a seventh distance d7 that is less than the sixth distance d6 from the second surface 12 in the thickness direction of the sapphire substrate 10 to overlap the third modified region R13 in a top-view as viewed from the second surface 12 side to form the seventh modified region R17 that includes the multiple second modified portions r17 arranged along the second direction m. The second modified portion r17 is shifted in the first direction a from the second modified portion r16 and overlaps the second modified portion r13 in a top-view. The second modified portion r17 is not limited to completely overlapping the second modified portion r13 in a top-view; rather, only a portion of the second modified portion r17 may overlap the second modified portion r13.

After the seventh modified region R17 is formed, the laser beam is scanned along the second direction m while discontinuously irradiating at a fourth distance d4 that is less than the seventh distance d7 from the second surface 12 in the thickness direction of the sapphire substrate 10 to be shifted in the first direction a from the seventh modified region R17 to form the fourth modified region R14 that includes the multiple second modified portions r14 arranged along the second direction m. The second modified portion r14 overlaps the second modified portion r15 in a top-view. The second modified portion r14 is not limited to completely overlapping the second modified portion r15 in a top-view; rather, only portion of the second modified portion r14 may overlap the second modified portion r15.

The cleaving line L is illustrated by a single dot-dash line in FIGS. 6 and 7. The cleaving line L is a virtual line. In this case, the wafer W is cleaved along the second direction m by pressing a pressing member onto the wafer W along the cleaving line L in the separation process after the laser irradiation process.

The fourth modified region R14 that is at the fourth distance d4 that is the shortest distance from the second surface 12 and the fifth modified region R15 that is at the fifth distance d5 that is the longest distance from the second surface 12 are positioned on the cleaving line L. At least a portion of the second modified portions r14 that form the fourth modified region R14 and at least a portion of the second modified portions r15 that form the fifth modified region R15 overlap the cleaving line L.

The first modified region R11 that includes the second modified portions r11, the second modified region R12 that includes the second modified portions r12, the third modified region R13 that includes the second modified portions r13, the sixth modified region R16 that includes the second modified portions r16, and the seventh modified region R17 that includes the second modified portions r17 are formed not to overlap the cleaving line L.

As shown in FIG. 6, the multiple modified regions R11 to R14 are arranged in the thickness direction of the sapphire substrate 10 in three columns. The fourth modified region R14 that includes the second modified portions r14 formed at the fourth distance d4 that is the shortest distance from the second surface 12 in the thickness direction of the sapphire substrate 10 and the fifth modified region R15 that includes the second modified portions r15 formed at the fifth distance d5 that is the longest distance from the second surface 12 are positioned in the center column among the three columns described above and are positioned on the cleaving line L.

The first modified region R11 that includes the second modified portions r11, the third modified region R13 that includes the second modified portions r13, and the seventh modified region R17 that includes the second modified portions r17 are positioned at one end column (e.g., the column at the left end in FIG. 6) among the three columns. The second modified region R12 that includes the second modified portions r12 and the sixth modified region R16 that includes the second modified portions r16 are positioned at another end column (e.g., the column at the right end in FIG. 6) among the three columns.

The second modified portions among the second modified portions r11, r12, r13, r16, and r17 that are not positioned on the cleaving line L and do not overlap each other in the thickness direction of the sapphire substrate 10 are shifted in mutually-opposite directions in the first direction a when referenced to the cleaving line L.

In the second irradiation process, the irradiation spacing along the second direction m of the laser beam when forming each of the modified regions R11 to R17 is, for example, not less than 6 μm and not more than 12 μm.

The multiple modified regions R11 to R17 that are formed in the second irradiation process are formed at different distances from the second surface 12 at the second spacing that is less than the first spacing in the thickness direction of the sapphire substrate 10 between the multiple modified regions R1 to R4 formed in the first irradiation process. In FIG. 6, the second spacing corresponds to the difference between the fifth distance d5 and the first distance d1, the difference between the first distance d1 and the second distance d2, the difference between the second distance d2 and the third distance d3, the difference between the third distance d3 and the sixth distance d6, the difference between the sixth distance d6 and the seventh distance d7, and the difference between the seventh distance d7 and the fourth distance d4. For example, the first spacing is not more than 200 μm not less than 120 μm, and the second spacing is not less than 60 μm and not more than 120 μm.

In the second irradiation process as well, similarly to the first irradiation process, one second modified portion is formed by irradiating the laser beam multiple times. However, the number of irradiations of the laser beam when forming one second modified portion in the second irradiation process is less than the number of irradiations of the laser beam when forming one first modified portion in the first irradiation process.

For example, one second modified portion r15 is formed by irradiating the laser beam two times at the same position. The scanning along the second direction m is repeated two times while irradiating the laser beam one irradiation at a time at the positions at which the second modified portions r15 are formed. By scanning the laser beam two times along the second direction m, the fifth modified region R15 that includes the multiple second modified portions r15 formed by irradiating the laser beam two times is formed.

One second modified portion r11 also is formed by, for example, irradiating the laser beam two times at the same position. The scanning along the second direction m is repeated two times while irradiating the laser beam one irradiation at a time at the positions at which the second modified portions r11 are formed. By scanning the laser beam two times along the second direction m, the first modified region R11 that includes the multiple second modified portions r11 formed by irradiating the laser beam two times is formed.

One second modified portion r12 also is formed by, for example, irradiating the laser beam two times at the same position. The scanning along the second direction m is repeated two times while irradiating the laser beam one irradiation at a time at the positions at which the second modified portions r12 are formed. By scanning the laser beam two times along the second direction m, the second modified region R12 that includes the multiple second modified portions r12 formed by irradiating the laser beam two times is formed.

One second modified portion r13 also is formed by, for example, irradiating the laser beam two times at the same position. The scanning along the second direction m is repeated two times while irradiating the laser beam one irradiation at a time at the positions at which the second modified portions r13 are formed. By scanning the laser beam two times along the second direction m, the third modified region R13 that includes the multiple second modified portions r13 formed by irradiating the laser beam two times is formed.

One second modified portion r16 also is formed by, for example, irradiating the laser beam two times at the same position. The scanning along the second direction m is repeated two times while irradiating the laser beam one irradiation at a time at the positions at which the second modified portions r16 are formed. By scanning the laser beam two times along the second direction m, the sixth modified region R16 that includes the multiple second modified portions r16 formed by irradiating the laser beam two times is formed.

One second modified portion r17 also is formed by, for example, irradiating the laser beam two times at the same position. The scanning along the second direction m is repeated two times while irradiating the laser beam one irradiation at a time at the positions at which the second modified portions r17 are formed. By scanning the laser beam two times along the second direction m, the seventh modified region R17 that includes the multiple second modified portions r17 formed by irradiating the laser beam two times is formed.

One second modified portion r14 also is formed by, for example, irradiating the laser beam two times at the same position. The scanning along the second direction m is repeated two times while irradiating the laser beam one irradiation at a time at the positions at which the second modified portions r14 are formed. By scanning the laser beam two times along the second direction m, the fourth modified region R14 that includes the multiple second modified portions r14 formed by irradiating the laser beam two times is formed.

The second irradiation process described above is performed for each of the multiple dicing streets D extending in the second direction m shown in FIG. 1.

In one wafer W, the number of the modified regions R11 to R17 formed at different distances (depths) from the second surface 12 in the second irradiation process is greater than the number of the modified regions R1 to R4 formed at different distances (depths) from the second surface 12 in the first irradiation process. According to the embodiment, seven modified regions are formed in the second irradiation process, and four modified regions are formed in the first irradiation process. The difference between the number of the modified regions R1 to R4 in the first irradiation process and the number of the modified regions R11 to R17 in the second irradiation process is, for example, not less than 2.

Strain occurs in the modified portions formed by the first and second irradiation processes, and cracks occur from the modified portions due to the release of the strain. The cracks that occur from the modified portions extend through the sapphire substrate 10 to connect between the modified portions in the thickness direction of the sapphire substrate 10. The cracks that occur from the modified portions may reach the first and second surfaces 11 and 12 of the sapphire substrate 10.

Separation Process

After the laser beam irradiation process, the separation process that separates the wafer W into multiple light-emitting elements is performed. For example, the wafer W is pressed along the cleaving line L by using a blade-shaped pressing member that extends along the dicing street D. The sapphire substrate 10 that is subjected to the pressure due to the pressing member is cleaved using the cracks that extend from the modified portions as starting points. For example, the pressing member is pressed along the cleaving line L from the first surface 11 side.

Figure 9A:
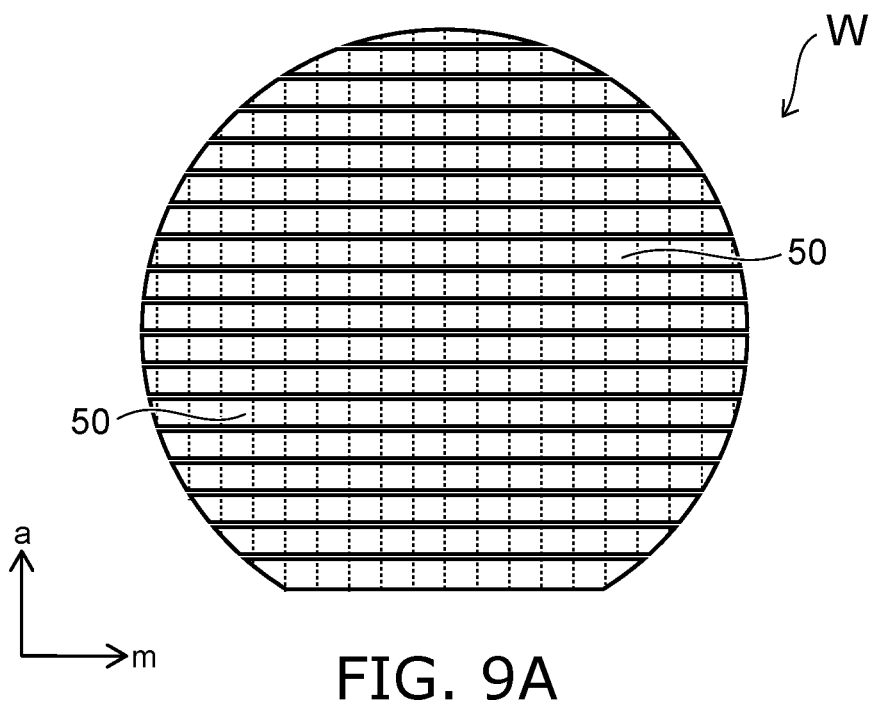
FIG. 9A is a schematic plan view showing a cleaving process of the method for manufacturing the light-emitting element according to the embodiment of the disclosure.

For example, first, the wafer W is cleaved along the dicing streets D extending along the second direction m, and the wafer W is separated into multiple separation portions 50 that extend in the second direction m as shown in FIG. 9A.

Figure 9B:
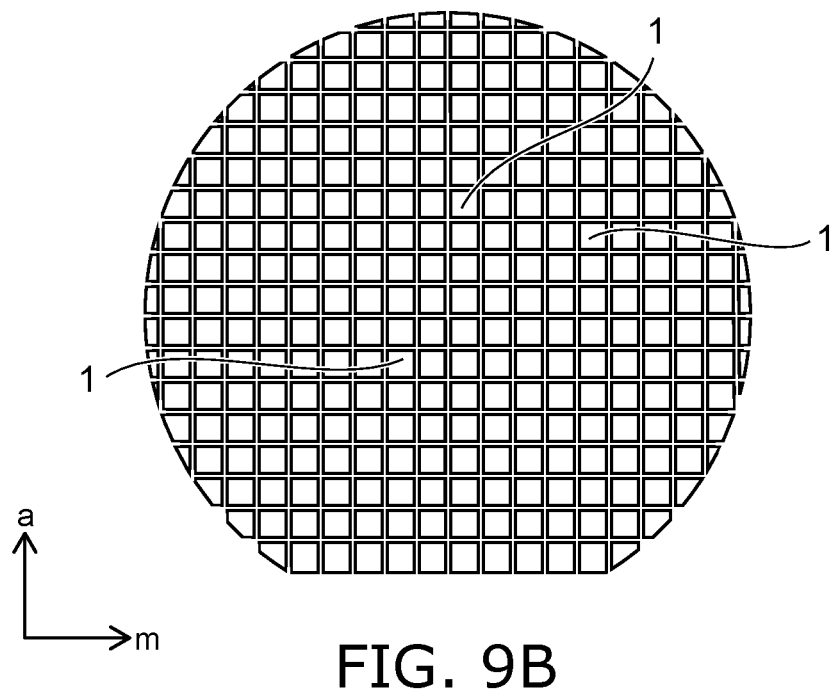
FIG. 9B is a schematic plan view showing a cleaving process of the method for manufacturing the light-emitting element according to the embodiment of the disclosure.

Subsequently, the separation portions 50 are cleaved along the dicing streets D extending along the first direction a, and the wafer W is singulated into multiple light-emitting elements 1 as shown in FIG. 9B. The cleaving along the first direction a may be performed first, and the cleaving along the second direction m may be performed subsequently.

At the side surfaces of the individual singulated light-emitting elements 1, the modified portions described above are exposed as regions that have greater surface roughness than the portions at which the modified portions are not formed.

Figure 10A:
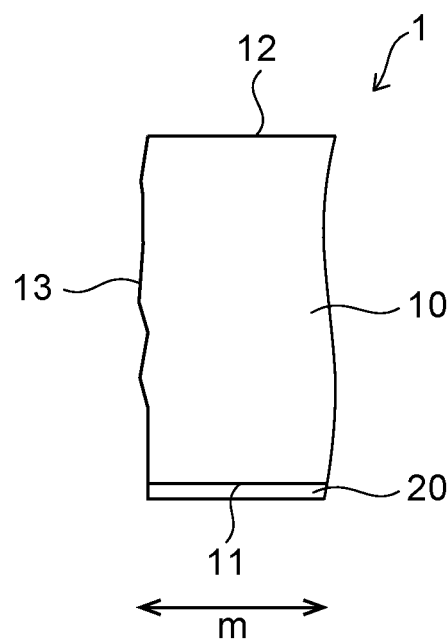
FIG. 10A is a schematic cross-sectional view showing a side surface of a light-emitting element manufactured according to the embodiment of the disclosure.
Figure 10B:
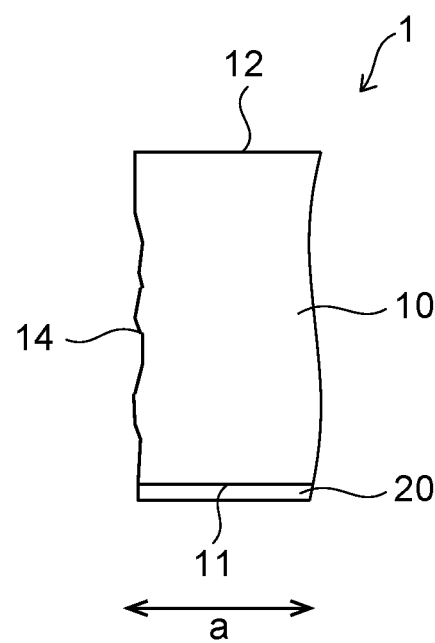
FIG. 10B is a schematic cross-sectional view showing a side surface of the light-emitting element manufactured according to the embodiment of the disclosure.

FIGS. 10A and 10B are schematic cross-sectional views showing side surfaces of the light-emitting element 1 manufactured according to the embodiment.

FIG. 10A illustrates a cross section along the second direction m, and the first direction a in FIG. 10A is a direction through the page surface. In other words, a first side surface 13 of the sapphire substrate 10 shown in FIG. 10A is formed by cleaving along the first direction a.

FIG. 10B illustrates a cross section along the first direction a, and the second direction m in FIG. 10B is a direction through the page surface. In other words, a second side surface 14 of the sapphire substrate 10 shown in FIG. 10B is formed by cleaving along the second direction m.

The light-emitting element 1 is a so-called face-down-mounted element; the element part 20 that is located at the first surface 11 of the sapphire substrate 10 is caused to face a wiring substrate and is mounted to the wiring substrate in a state in which the second surface 12 of the sapphire substrate 10 faces upward from the wiring substrate. The planar shape of the light-emitting element 1 is rectangular, and includes a pair of first side surfaces 13 along the first direction a and a pair of second side surfaces 14 along the second direction m of the sapphire substrate 10. The light from the face-down-mounted light-emitting element 1 travels toward the sapphire substrate 10 side and is mainly extracted from the first and second side surfaces 13 and 14 of the sapphire substrate 10.

For example, the element part 20 emits deep ultraviolet light, the thickness of the sapphire substrate 10 is 700 μm, and the first side surface 13 and the second side surface 14 contact air. The light from the element part 20 is mainly extracted to the outside from the first and second side surfaces 13 and 14 of the sapphire substrate 10. In such a light-emitting element 1, the light extraction efficiency can be increased by forming unevennesses in the first and second side surfaces 13 and 14. There is tendency for light of relatively short wavelengths such as deep ultraviolet light to be difficult to extract from the interfaces between the air and the first and second side surfaces 13 and 14 of the sapphire substrate 10. By setting the thickness of the sapphire substrate 10 to be, for example, relatively thick, i.e., not less than 500 μm and not more than 1000 μm, the light extraction efficiency can be increased by increasing the surface areas of the first and second side surfaces 13 and 14.

When cleaving along the a-axis direction of the sapphire substrate 10, cracking easily occurs in an oblique direction (a direction that is oblique to the first and second surfaces 11 and 12) along the crystal plane due to the fissility of the sapphire substrate 10. Therefore, the first side surface 13 that is formed by cleaving along the first direction a that is parallel to the a-axis direction is formed in an uneven shape as shown in FIG. 10A.

On the other hand, the cleaving along the m-axis direction of the sapphire substrate 10 is in a crystal orientation of the sapphire substrate 10 that has no fissility. Therefore, in a reference example in which modified regions are formed along the second direction m at six different distances from the second surface 12 in the thickness direction of the sapphire substrate 10 so that six modified regions are positioned on the cleaving line L, cracks extend in straight lines to connect the modified regions arranged in the thickness direction of the sapphire substrate 10 along the cleaving line L. As a result, the side surface of the sapphire substrate 10 formed by the cleaving along the second direction m becomes substantially perpendicular to the first and second surfaces 11 and 12.

According to the embodiment, in the second irradiation process along the second direction m as shown in FIG. 6, the second modified portions are formed to be shifted in mutually-opposite directions along the first direction a when referenced to the cleaving line L. Thereby, the cracks that extend to connect between the second modified portions are not straight along the cleaving line L, but zigzag across the cleaving line L oblique to the cleaving line L. An unevenness is formed in the cracking cross section that is cleaved using such cracks as starting points. In other words, as shown in FIG. 10B, the second side surface 14 that is formed by the cleaving along the second direction m that is parallel to the m-axis direction can be formed in an uneven shape.

The second spacing between the modified regions R11 to R17 formed at different distances from the second surface 12 in the second irradiation process is set to be less than the first spacing between the modified regions R1 to R4 formed at different distances from the second surface 12 in the first irradiation process, and the number of the modified regions R11 to R17 is set to be greater than the number of the modified regions R1 to R4. The number of the protrusions formed in the second side surface 14 can be increased thereby. The light extraction efficiency can be increased by increasing the number of the protrusions in the side surface of the sapphire substrate 10.

The modified regions that are positioned at the two thickness-direction ends of the sapphire substrate 10, i.e., the fourth modified region R14 that is most proximate to the second surface 12 and the fifth modified region R15 that is most proximate to the first surface 11, are positioned on the cleaving line L. Thereby, the cracks can be prevented from extending to be shifted from the cleaving line L at the first surface 11 side and the second surface 12 side, and chipping of the sapphire substrate 10 at the first surface 11 side and the second surface 12 side when cleaving can be suppressed.

In the first irradiation process of forming the modified regions R1 to R4 for cleaving along the first direction a that has fissility, the number of the modified regions R1 to R4 is set to be less than the number of the modified regions R11 to R17 formed in the second irradiation process, and the first spacing between the modified regions R1 to R4 is set to be greater than the second spacing between the modified regions R11 to R17. When cleaving along the first direction a, the area of the surface that cracks obliquely along the crystal plane of the sapphire substrate 10 can be increased thereby. Therefore, the first side surface 13 in which each protruding shape is large is easily formed, and the light extraction efficiency can be increased even more.

The first spacing between the modified regions R1 to R4 in the first irradiation process is greater than the second spacing between the modified regions R11 to R17 in the second irradiation process. Therefore, in the first irradiation process, compared to the second irradiation process, there is a tendency for cracks that connect between the modified regions R1 to R4 to be difficult to form. Therefore, in the first irradiation process, compared to the second irradiation process, the number of irradiations of the laser beam when forming one modified portion is increased; thereby, the crack that extends from one modified portion can easily extend, and the cracks that connect between the modified regions R1 to R4 are easily formed. Thereby, the cleaving can be easily performed even when the spacing between the modified regions R1 to R4 is relatively wide.

Here, as a reference example, modified regions were formed along the first and second directions a and m at six different distances from the second surface 12 in the thickness direction of the sapphire substrate 10 so that six modified regions were positioned on the cleaving line L in the two directions of the first and second directions a and m, and the wafer W was cleaved. Also, in the reference example, the spacing was the same between the modified regions formed in the thickness direction of the sapphire substrate 10 along the first and second directions a and m in the first and second irradiation processes, and all of the modified regions were formed along the cleaving line L. Compared to the light-emitting element obtained according to such a reference example, the output of the light-emitting element 1 obtained by cleaving the wafer W according to the embodiment described above was improved an average of 8%. The light-emitting element according to the embodiment includes an unevenness in the side surface of the cleaved sapphire substrate 10 and has a higher light extraction efficiency.

Embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Further, within the scope of the spirit of the present invention, one skilled in the art can conceive various modifications that fall within the scope of the present invention.

What is claimed is:

1. A method for manufacturing a light-emitting element, the method comprising:
    providing a wafer comprising:
        a sapphire substrate having a first surface and a second surface opposite the first surface, and
        an element part that comprises a semiconductor layer located at the first surface;
    irradiating a laser beam into an interior of the sapphire substrate through the second surface side of the wafer, which comprises:
        a first irradiation process of scanning the laser beam along a first direction parallel to an a-axis direction of the sapphire substrate to form a plurality of first modified portions along the first direction in the interior of the sapphire substrate, the formation of the plurality of first modified portions being performed multiple times to form a plurality of modified regions at a first spacing at different distances from the second surface, each of the plurality of modified regions formed at the first spacing comprising the plurality of first modified portions along the first direction, and
        a second irradiation process of scanning the laser beam along a second direction parallel to an m-axis direction of the sapphire substrate to form a plurality of second modified portions along the second direction in the interior of the sapphire substrate, the formation of the plurality of second modified portions being performed multiple times to form a plurality of modified regions at a second spacing at different distances from the second surface, each of the plurality of modified regions formed at the second spacing comprising the plurality of second modified portions along the second direction, the second spacing being less than the first spacing,
    wherein the second irradiation process comprises:
        forming a first modified region at a first distance from the second surface in a thickness direction of the sapphire substrate,
        forming a second modified region at a second distance from the second surface in the thickness direction of the sapphire substrate, the second distance being less than the first distance, the second modified region being shifted in the first direction from the first modified region, and forming a third modified region at a third distance from the second surface in the thickness direction of the sapphire substrate, the third distance being less than the second distance, the third modified region overlapping the first modified region in a top-view, wherein, in the thickness direction of the sapphire substrate, a number of the modified regions that include the second modified portions formed is greater than a number of the modified regions that include the first modified portions; and after the step of irradiating a laser beam, separating the wafer into a plurality of light-emitting elements at the plurality of modified regions.

2. The method according to claim 1, wherein:

among the modified regions that include the plurality of second modified portions located in the thickness direction of the sapphire substrate, a fourth modified region formed at a fourth distance from the second surface and a fifth modified region formed at a fifth distance from the second surface are formed on a cleaving line along the second direction, the fourth distance being a shortest distance from the second surface, the fifth distance being a longest distance from the second surface, in the thickness direction of the sapphire substrate, the first modified region, the second modified region, and the third modified region are formed between the fourth modified region and the fifth modified region, and do not overlap the cleaving line in a top-view, and in the step of separating the wafer, the wafer is separated into the plurality of light-emitting elements by pressing the wafer along the cleaving line.

3. The method according to claim 1, wherein:

each of the first modified portions is formed by irradiating the laser beam multiple times, each of the second modified portions is formed by irradiating the laser beam multiple times, and a number of irradiations of the laser beam when forming each of the first modified portions is greater than a number of irradiations of the laser beam when forming each of the second modified portions.

4. The method according to claim 2, wherein:

each of the first modified portions is formed by irradiating the laser beam multiple times, each of the second modified portions is formed by irradiating the laser beam multiple times, and a number of irradiations of the laser beam when forming each of the first modified portions is greater than a number of irradiations of.

5. The method according to claim 1, wherein:

a thickness of the sapphire substrate is not less than 500 µm and not more than 1000 µm.

6. The method according to claim 2, wherein:

a thickness of the sapphire substrate is not less than 500 µm and not more than 1000 µm.

7. The method according to claim 3, wherein:

a thickness of the sapphire substrate is not less than 500 µm and not more than 1000 µm.

8. The method according to claim 1, wherein:

the first spacing is not less than 120 µm and not more than 200 µm, and the second spacing is not less than 60 µm and not more than 120 µm.

9. The method according to claim 2, wherein:

the first spacing is not less than 120 µm and not more than 200 µm, and the second spacing is not less than 60 µm and not more than 120 µm.

10. The method according to claim 3, wherein:

the first spacing is not less than 120 µm and not more than 200 µm, and the second spacing is not less than 60 µm and not more than 120 µm.

11. The method according to claim 1, wherein:

a difference between a number of the modified regions that include the first modified portions and a number of the modified regions that include the second modified portions is not less than 2.

12. The method according to claim 2, wherein:

a difference between a number of the modified regions that include the first modified portions and a number of the modified regions that include the second modified portions is not less than 2.

13. The method according to claim 3, wherein:

a difference between a number of the modified regions that include the first modified portions and a number of the modified regions that include the second modified portions is not less than 2.

14. The method according to claim 5, wherein:

a difference between a number of the modified regions that include the first modified portions and a number of the modified regions that include the second modified portions is not less than 2.

* * * * *